United States Patent
Battacharya et al.

(10) Patent No.: US 6,950,355 B2
(45) Date of Patent: Sep. 27, 2005

(54) SYSTEM AND METHOD TO SCREEN DEFECT RELATED RELIABILITY FAILURES IN CMOS SRAMS

(75) Inventors: Surya Battacharya, Irvine, CA (US); Ming Chen, Mission Viejo, CA (US); Guang-Jye Shiau, Irvine, CA (US); Liming Tsau, Irvine, CA (US); Henry Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/020,208

(22) Filed: Dec. 18, 2001

(65) Prior Publication Data

US 2003/0036231 A1 Feb. 20, 2003

Related U.S. Application Data

(60) Provisional application No. 60/312,793, filed on Aug. 17, 2001.

(51) Int. Cl.$^7$ ............................................. G11C 7/00
(52) U.S. Cl. ...................................... 365/201; 365/154
(58) Field of Search ........................... 365/201, 189.04, 365/189.05, 185.09, 154

(56) References Cited

U.S. PATENT DOCUMENTS

| | | | | |
|---|---|---|---|---|
| 5,241,266 A | * | 8/1993 | Ahmad et al. | 714/733 |
| 5,339,277 A | * | 8/1994 | McClure | 365/230.08 |
| 5,504,369 A | * | 4/1996 | Dasse et al. | 257/620 |
| 5,568,435 A | * | 10/1996 | Marr | 365/201 |
| 5,619,462 A | * | 4/1997 | McClure | 365/201 |
| 5,661,729 A | | 8/1997 | Miyazaki et al. | 714/719 |
| 5,745,415 A | | 4/1998 | Marr | 365/201 |
| 5,835,427 A | * | 11/1998 | McClure | 365/201 |
| 5,956,279 A | * | 9/1999 | Mo et al. | 365/201 |
| 6,037,792 A | * | 3/2000 | McClure | 324/760 |
| 6,038,181 A | | 3/2000 | Braceras et al. | 365/201 |
| 6,081,464 A | | 6/2000 | Marr | 365/201 |
| 6,115,304 A | | 9/2000 | Suga | 365/201 |
| 6,118,138 A | * | 9/2000 | Farnworth et al. | 257/48 |
| 6,154,403 A | | 11/2000 | Tanzawa et al. | 365/203 |
| 6,233,184 B1 | * | 5/2001 | Barth et al. | 365/201 |
| 6,426,904 B2 | * | 7/2002 | Barth et al. | 365/201 |

* cited by examiner

*Primary Examiner*—Gene Auduong
(74) *Attorney, Agent, or Firm*—Sterne, Kessler, Goldstein & Fox, p.l.l.c.

(57) ABSTRACT

A method for testing a semiconductor wafer. An array of probes is coupled to the semiconductor wafer. Then a voltage difference is applied across a plurality of adjacent metal line pairs (e.g., wordline and/or bitline pairs) of one or more SRAM arrays of at least one die. Application of the voltage difference induces failure of metal stringers or defects between the adjacent lines. Additionally, the voltage can be applied across respective pairs of substantially all parallel metal lines of the one or more SRAM arrays of more that one die of the semiconductor wafer.

13 Claims, 3 Drawing Sheets

SYSTEM AND METHOD TO SCREEN DEFECT RELATED RELIABILITY FAILURES IN CMOS SRAMS

CROSS-REFERENCE TO RELATED APPLICATIONS

This application claims priority to Provisional U.S. Patent Application No. 60/312,793, filed Aug. 17, 2001, which is incorporated herein by reference in its entirety.

BACKGROUND OF THE INVENTION

1. Field of the Invention

The present invention relates generally to semiconductor wafers, manufacturing and testing. More particularly, the present invention relates to a system and method to screen defect related reliability failures at the wafer-level in CMOS SRAMs.

2. Related Art

Fabrication of integrated circuit devices is a complicated process. Each step of the process impacts the overall reliability of the end product. Some defects are initially nonfatal, but can cause failures early in the life of a product. This is called infant mortality. Typically, failure rates decrease rapidity to a low value that remains steady until the end of the lifetime of the product when failure rates increase again. Plots of this data are called a bathtub curve. Various wear out mechanisms include hot-electron wear out, electromigration, and failure of antifuses in FPGAs.

"Burn-in" refers to the process of accelerating failures that occur during the infant mortality phase of component life in order to remove the inherently weaker IC's. The process has been regarded as critical for product reliability since the semiconductor industry began. There have been two basic types of burn-in. During the process known as "static" burn-in, temperatures are increased (to 125° C. for example, or sometimes decreased) while only some of the pins on a test IC are biased. No data is written to the IC, nor is the IC exercised under stress during static burn-in. During "un-monitored dynamic" burn-in, temperatures are increased while the pins on the test IC are exercised. Extensive infrastructure is typically required, including special burn-in boards and sockets for embedded logic SRAMs (static random access memories), and the like. In SRAMs that are fabricated in CMOS (complementary metal oxide silicon) technology, three or more metal layers are employed above the silicon substrate and are commonly sued for electrical connections in the SRAM memory array. One mode of early reliability failure of SRAMs is the formation of electrical shorts between laterally adjacent metal lines that are closely spaced. Such shorts are believed to be caused by the presence of metal stingers due to incomplete metal etching, polishing, or defects that are deposited on various layers during wafer processing. The inventors have discovered that infant mortality in SRAMs can occur when adjacent, closely spaced metal lines with stingers in between them short due to breakdown of the oxide separating the defect/stinger and an adjacent metal line. Such defects can be screened at wafer sort instead of burn-in for packaged devices.

Various burn-in testing procedures and circuits are known. Examples include the following U.S. Pat. No. 5,504,369 to Dasse et al. (which describes an apparatus for performing wafer level testing), U.S. Pat. Nos. 5,835,427 and 6,037,792, both to McClure, and U.S. Pat. No. 5,956,279 to Mo et al. (which each describe a specific SRAM burn-in test circuit), and U.S. Pat. No. 6,118,138 to Farnworth et al. (which describes an overview of burn-in and discloses a wafer having integrated therein circuitry to simplify wafer level probing).

What is desired, however, is a technique for specific screening at wafer sort for stingers between closely spaced metal lines, without the need of elevated temperatures, special boards or sockets.

SUMMARY OF THE INVENTION

According to the present invention a voltage difference is applied between closely spaced, adjacent metal lines in a SRAM cell during circuit probing, so as to short any existing metal stingers or defects. A DC voltage of the supply level or higher is applied using on-chip delivery circuitry during probing. The voltage can be applied across adjacent pairs of lines of a given metal wiring layer, or plural metal layers.

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE PREFERRED EMBODIMENTS

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate.

Figure 1:
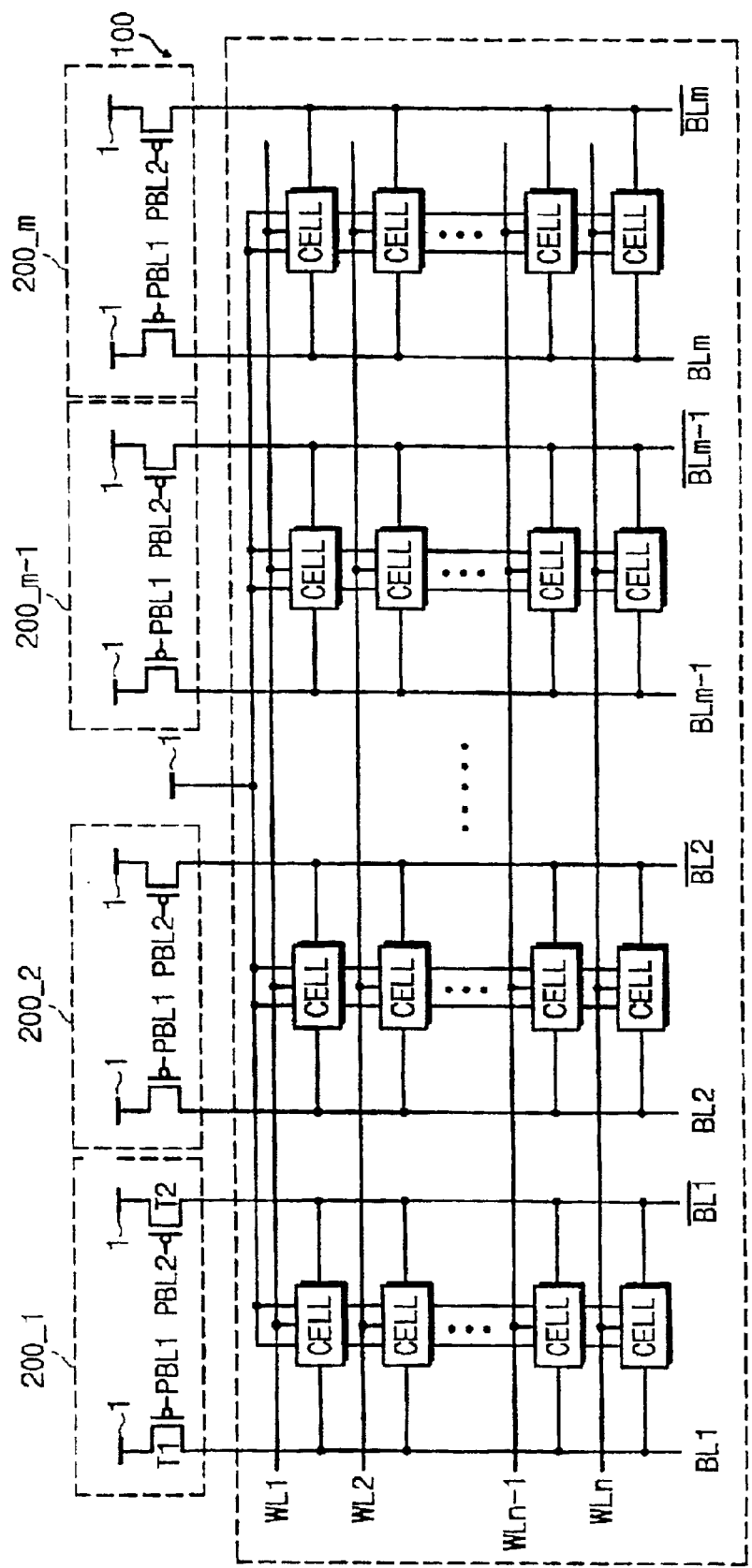
FIG. 1 is a schematic circuit diagram of a conventional SRAM device.

FIG. 1 is a schematic circuit diagram of a conventional static random access memory (hereinafter, referred to as SRAM) device. Referring to FIG. 1, the SRAM includes an array 100 of memory cells arranged in rows and columns, bit lines BLi and (where, i equals 1 to m), word lines WLj (where, j equals 1 to n), and bit line precharge circuits 200_1 to 200_m. A pair of bit lines and a word line correspond to each memory cell. Each of the bit line precharge circuits 200_i (i equals 1 to m) includes two transistors T1 and T2, which selectively deliver current to corresponding a bit line pair during normal and test modes in response to control signals PBL1 and PBL2. The positive supply voltage connections are labeled as reference number 1.

Figure 2:
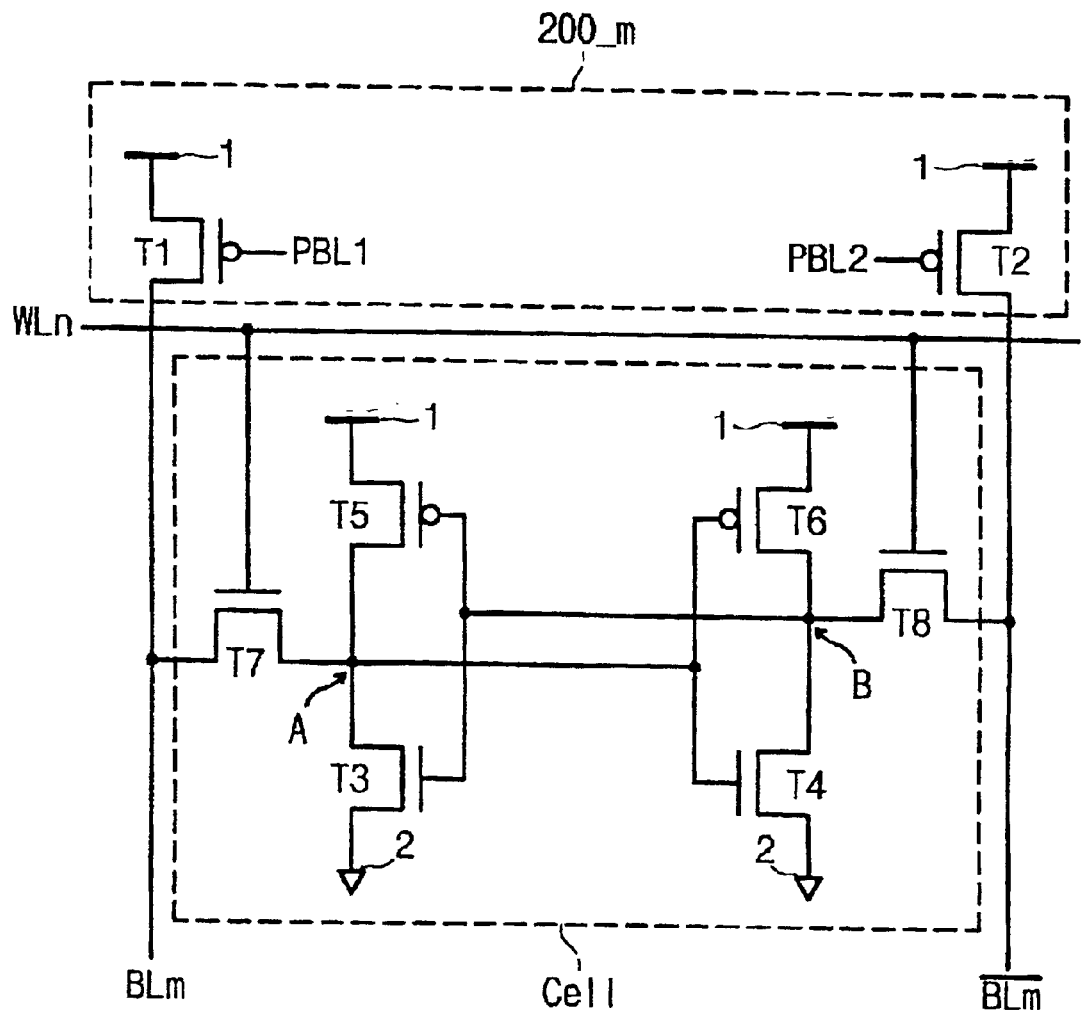
FIG. 2 is a schematic circuit diagram of an typical SRAM cell with a corresponding bit line precharge circuit.

FIG. 2 is a schematic circuit diagram of a typical six transistor CMOS SRAM cell with a corresponding bit line precharge circuit. The six transistor cell of FIG. 2 is capable of storing one binary bit of information. AS illustrated in FIG. 2, the memory cell includes a bistable circuit comprising transistors T3, T4, T5, and T6. The memory cell further includes access transistors T7 and T8 that function as switches, each of which being coupled between the bistable circuit and corresponding bit line BLi or 0. In a conventional wafer burn-in test modes for such cell are described in the '279 patent. The negative supply voltage connections are labeled as reference number 2.

During normal circuit operation, closely spaced metal lines in the SRAM array do not necessarily see the full supply voltage swing (e.g., VDD to VSS voltage drop between reference numbers 1 and 2). In cases where the full swing of VDD to VSS is available, the duration of such a voltage across closely spaced lines is not sufficient to cause stingers to short out. This makes the application of a large voltage between closely spaced metal lines not directly feasible for testing purposes. In order to apply a large enough voltage across closely spaced, repeated metal lines in the memory array, the inventors have considered separate cases of metal lines for typical CMOS SRAMs: Metal-1, Metal-2 and Metal-3. When Metal-1 is used for the connection between the two inverters of the in the SRAM cell, the Metal-1 lines are usually biased at opposite voltage during normal operation. However, Metal-2 and Metal-3 lines, which are used for wordline connections or for bitlines, do not lend themselves to being biased at full supply voltage swing. Thus, according to the present invention, the inventors propose additional circuitry to bias closely spaced wordlines and bitlines at opposite voltages (e.g., VDD and VSS).

The purpose of the additional circuitry is to expose such metal lines to higher voltages to screen for metal stingers and defects. SRAMs that pass the screening test are much less likely to experience the failure mode involving electrical shorting of adjacent, closely spaced metal lines during long term operation.

Figure 3:
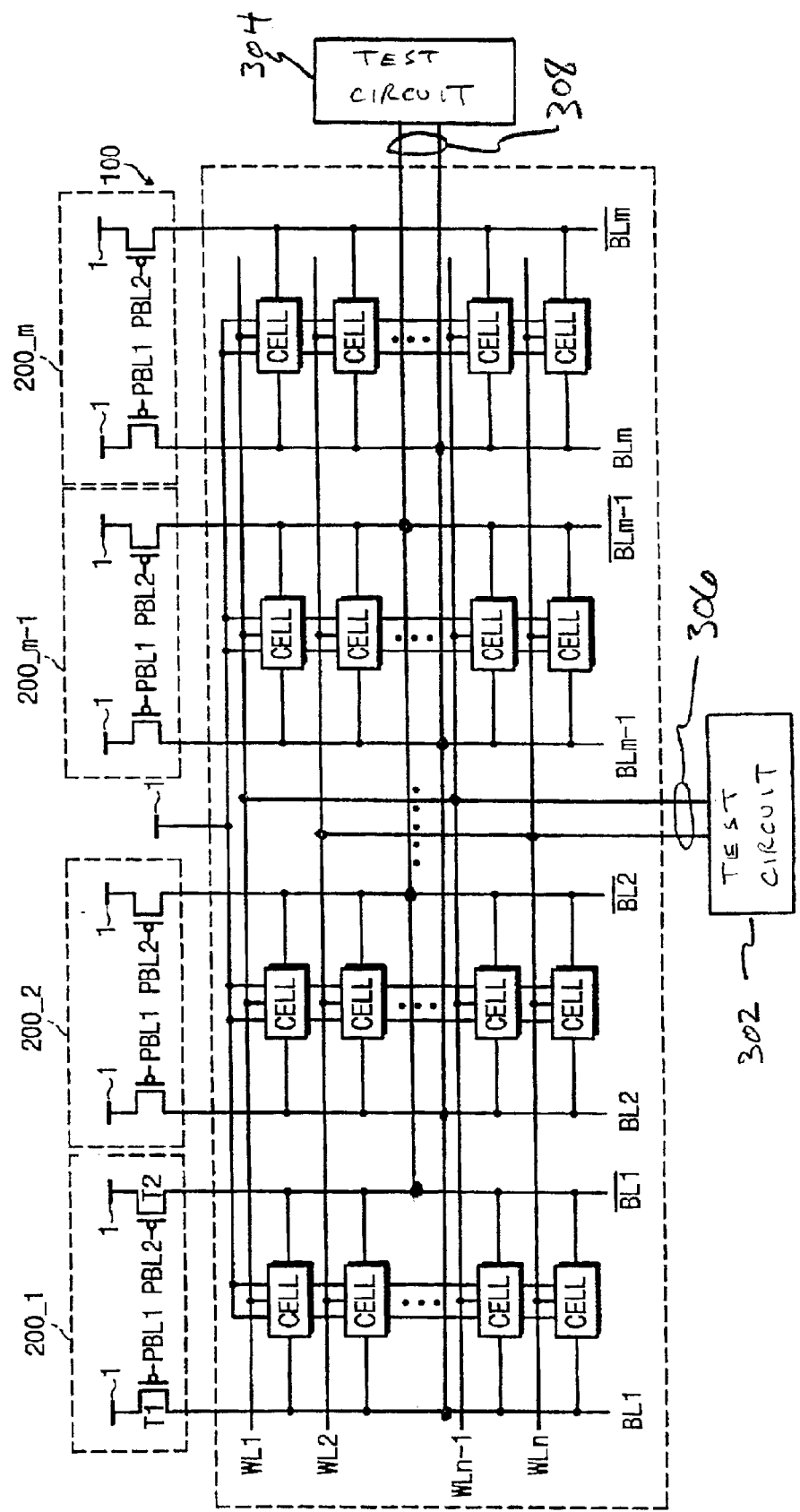
FIG. 3 is a schematic circuit diagram illustrating the present invention.

FIG. 3 is a schematic circuit diagram illustrating the present invention. Test circuits 302 and 304 are each coupled to the wordlines and bitlines via a pair of connections, 306 and 308, respectively. Connections 306 and 308 are coupled to the wordlines and bitlines so as to provide for alternate biasing of closely spaced adjacent metal lines of a given metal wiring layer. Since many different memory cell arrangements are possible, FIG. 3 is provided for illustration purposes only.

As would become apparent to a person skilled in the art, the actual implementation of test circuits 302 and 304, and the proper coupling of connections 306 and 308 will vary depending on the several factors including, but not limited to: the specific arrangement of the memory cell transistors; the number and type of metal wiring layers used; the layout of the array of memory cells with respect to each other, and with respect to ancillary circuits. Thus, as would become apparent to a person skilled in the art, additional coupling/decoupling transistors, and the like, may be required to couple connections 306 and 308 to the closely spaced adjacent metal wordlines or bitlines. In still other embodiments, it is envisioned that a plurality of testing circuits would be used.

A main advantage of testing according to the present invention is that it can be performed during the wafer sort stage of manufacturing. While conventional burn-in methods require extensive infrastructure in terms of burn-in boards, sockets, and the like, testing according to the present invention can be at room temperature at the wafer level. Moreover, testing according to the present invention can be performed in parallel for many adjacent pairs of metal lines.

According to the present invention, a method for testing a semiconductor wafer, which typically has a plurality of die, begins with coupling an array of probes to the semiconductor wafer. Then a voltage difference is applied across a plurality of adjacent metal line pairs (e.g., wordline and/or bitline pairs) of one or more SRAM arrays of at least one die. Application of the voltage difference induces failure of metal stringers or defects between the adjacent bit lines. Additionally, the voltage can be applied across respective pairs of substantially all parallel metal lines of the one or more SRAM arrays of more that one die of the semiconductor wafer.

It is preferable that the voltage be sufficiently larger than an operational supply voltage for SRAM arrays. In one embodiment, a voltage at a magnitude of equal to or greater than two times the operational supply voltage is applied. However, the actual magnitude of the voltage depends on the specific metal line layout and other process variables, as would become apparent to a person skilled in the relevant art. In another embodiment, the step of applying a voltage across adjacent bitlines or wordlines occurs at an elevated temperature.

Conclusion

The present invention can be implemented with various changes and substitutions to the illustrated embodiments. For example, the present invention may be implemented on wafers comprised of materials other that silicon, such as, for example, gallium arsenide or sapphire. Additionally, a testing circuit according to the present invention can be used to test a single metal layer or to simultaneously test plural metal layers.

While various embodiments of the present invention have been described above, it should be understood that they have been presented by way of example, and not limitation. It will be apparent to persons skilled in the relevant art that various changes in form and detail can be made therein without departing from the spirit and scope of the invention. This is especially true in light of technology and terms within the relevant art(s) that may be later developed.

The present invention has been described above with the aid of functional building blocks or modules (see FIG. 3, items 200_1-m, 302 and 304, for example) illustrating the performance of specified functions and relationships thereof. The boundaries of these functional building blocks have been defined herein for the convenience of the description.

Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

We claim:

1. A method of testing a semiconductor wafer, the semiconductor wafer having a plurality of die that contain static random access memory (SRAM) arrays, comprising the steps of:
   (a) coupling an array of probes to the semiconductor wafer;
   (b) applying a voltage difference across a pair of closely spaced wordlines or bitlines of one or more static random access memory (SRAM) arrays, wherein the voltage difference across the pair of closely spaced wordlines or bitlines exceeds a voltage difference that the wordlines or bitlines would experience in normal operation; and
   (c) identifying whether electrical shorting occurs across said pair of closely spaced wordlines or bitlines.

2. The method of claim 1, further comprising the step of simultaneously applying the voltage difference across respective pairs of substantially all parallel bitline pairs and/or wordline pairs of the one or more SRAM arrays.

3. The method of claim 1, further comprising the step of simultaneously applying a voltage across respective pairs of substantially all parallel bitline pairs and/or wordlines pairs of the one or more SRAM arrays of more than one die of the semiconductor wafer.

4. The method of claim 1, further comprising the step of applying the voltage difference across other adjacent, parallel metal lines of the one or more SRAM arrays.

5. The method of claim 1, further comprising the step of applying the voltage difference at a magnitude of equal to or greater than two times the operational supply voltage.

6. The method of claim 2, further comprising the step of applying the voltage difference at a magnitude of equal to or greater than two times the operational supply voltage.

7. The method of claim 3, further comprising the step of applying the voltage difference at a magnitude of equal to or greater than two times the operational supply voltage.

8. The method of claim 4, further comprising the step of applying the voltage difference at a magnitude of equal to or greater than two times the operational supply voltage.

9. The method of claim 1, further comprising the step of prerforming step b at an elevated temperature.

10. The method of claim 9, further comprising the step of applying the voltage difference at a magnitude of equal to or greater than two times the operational supply voltage.

11. The method of claim 3, further comprising the step of prerforming step b at an elevated temperature.

12. The method of claim 4, further comprising the step of prerforming step b at an elevated temperature.

13. A semiconductor wafer having one or more die with a static random access memory (SRAM) array integrated therein, comprising:
   a test circuit integrated with the SRAM array; and
   connections that couple said test circuit to the SRAM array;
   wherein during probing, said test circuit applies a voltage difference across a plurality of adjacent bitline pairs and/or worldine pairs of the SRAM array, the voltage difference being larger than an operational supply voltage for the SRAM array, to identify whether electrical shorting occurs across one or more of said plurality of adjacent bitline pairs and/or wordline pairs.

* * * * *

UNITED STATES PATENT AND TRADEMARK OFFICE
CERTIFICATE OF CORRECTION

PATENT NO.         : 6,950,355 B2                                    Page 1 of 1
APPLICATION NO.    : 10/020208
DATED              : September 27, 2005
INVENTOR(S)        : Battacharya et al.

It is certified that error appears in the above-identified patent and that said Letters Patent is hereby corrected as shown below:

- On the Title page item 75, "Battacharya" should be replaced with --Bhattacharya--.
- On the Title page, Ming Chen's city address "Mission Viejo" should be replaced with --Newport Coast--.
- Column 6, lines 16, 21, and 23, "prerforming" should be replaced with --performing--.

Signed and Sealed this

Twenty-seventh Day of November, 2007

JON W. DUDAS
*Director of the United States Patent and Trademark Office*